(12) United States Patent  (10) Patent No.: US 9,087,844 B2
Kim et al.  (45) Date of Patent: Jul. 21, 2015

(54) SEMICONDUCTOR DEVICE AND FABRICATING METHOD THEREOF

(71) Applicants: Dong-Kwon Kim, Yongin-si (KR); Ki-Il Kim, Suwon-si (KR)

(72) Inventors: Dong-Kwon Kim, Yongin-si (KR); Ki-Il Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 13 days.

(21) Appl. No.: 13/930,187

(22) Filed: Jun. 28, 2013

(65) Prior Publication Data

US 2014/0061917 A1 Mar. 6, 2014

(30) Foreign Application Priority Data

Aug. 28, 2012 (KR) .................. 10-2012-0094478

(51) Int. Cl.
| | |
|---|---|
| *H01L 23/528* | (2006.01) |
| *H01L 23/522* | (2006.01) |
| *H01L 23/485* | (2006.01) |
| *H01L 21/768* | (2006.01) |
| *H01L 29/417* | (2006.01) |
| *H01L 29/78* | (2006.01) |
| *H01L 29/49* | (2006.01) |
| *H01L 23/532* | (2006.01) |

(52) U.S. Cl.
CPC ........ *H01L 23/528* (2013.01); *H01L 21/76805* (2013.01); *H01L 21/76813* (2013.01); *H01L 21/76816* (2013.01); *H01L 23/485* (2013.01); *H01L 23/5226* (2013.01); *H01L 23/53295* (2013.01); *H01L 29/41791* (2013.01); *H01L 29/4966* (2013.01); *H01L 29/785* (2013.01); *H01L 23/53238* (2013.01); *H01L 2924/0002* (2013.01)

(58) Field of Classification Search
CPC ...................................................... H01L 23/528
USPC ........... 257/751; 438/633, 638, 686, 687, 688
See application file for complete search history.

(56) References Cited

U.S. PATENT DOCUMENTS

| | | | | |
|---|---|---|---|---|
| 6,806,579 | B2 * | 10/2004 | Cowley et al. | 257/762 |
| 2005/0048767 | A1 * | 3/2005 | Matsumoto | 438/629 |
| 2005/0082089 | A1 * | 4/2005 | Grunow et al. | 174/266 |
| 2007/0037374 | A1 |  2/2007 | Hayashi et al. | |
| 2009/0298280 | A1 * | 12/2009 | Yang et al. | 438/637 |

FOREIGN PATENT DOCUMENTS

| | | |
|---|---|---|
| JP | 2001176872 | 6/2001 |
| JP | 2004031866 | 1/2004 |
| JP | 2012009617 | 1/2012 |
| KR | 1020010086522 | 9/2001 |
| KR | 100379530 | 3/2003 |
| KR | 100667905 | 1/2007 |
| KR | 102008091990 A | 10/2008 |

* cited by examiner

*Primary Examiner* — Peniel M Gumedzoe

(74) *Attorney, Agent, or Firm* — Volentine & Whitt, PLLC

(57) ABSTRACT

A semiconductor device includes a lower conductor having a lower conductor sidewall, a barrier film having a barrier film sidewall formed directly on the lower conductor sidewall, and a via formed on a top surface of the lower conductor. A top portion of the barrier film sidewall is recessed, such that a top surface of the barrier film sidewall is at a level lower than the top surface of the lower conductor.

20 Claims, 19 Drawing Sheets

US 9,087,844 B2

SEMICONDUCTOR DEVICE AND FABRICATING METHOD THEREOF

CROSS-REFERENCE TO RELATED APPLICATION

This application claims priority under 35 U.S.C. 119 from Korean Patent Application No. 10-2012-0094478 filed on Aug. 28, 2012, the subject matter of which is hereby incorporated by reference.

BACKGROUND

The inventive concept is generally related to semiconductor devices and methods of fabricating same.

Contemporary semiconductor devices are fabricated through a complex sequence of fabrication processes. Some of these processes involve the preparation of substrates, the deposition of materials, the selective etching of material portions, the cleaning of substrates, etc. In the applied aggregate, the complex sequence of semiconductor fabrication processes form very minute structures, components, elements, regions, connections, features, and the like. Emerging semiconductor devices are for the most part even more densely integrated than their predecessors. Thus, the constituent components of contemporary semiconductor devices are designed to be in very close proximity one to another and are generally characterized by incredibly small geometries. Such narrowing proximities and decreasing size necessitate great precision in the application of fabrication processes, as even very small departures from intended design may result in catastrophic failure of the overall semiconductor device.

Nearly all contemporary semiconductor devices include multiple conductive elements arranged at different material layers above a principal substrate. Assigning arbitrary directionality to a semiconductor device, one might say that constituent material layers, and therefore many components and/or regions formed from the material layers extend "laterally" across (or "over") the primary surface of the substrate. In this context, certain "vertical" electrical connections may be formed between a lower "conductor" (e.g., element or region) and an upper conductor using a structure that will be generically referred to as a via. Hence the term "via" denotes a conductive interconnection extending vertically between two or more conductors disposed at least in part at different "heights" or "levels" (in a Z-direction) above a semiconductor device fabricated on the lateral surface (in X/Y directions) of a substrate.

Recognizing the challenges noted above in the ever decreasing size, scale, geometries and separation distances between semiconductor components, the accurate fabrication of lower conductors, upper conductors, and respective connecting vias are matters of careful consideration and troublesome implementation.

For example, if misalignment occurs between a lower conductor and via, the resulting electrical resistance between the lower conductor and the via may undesirably increase. Further, during the course of via hole formation, an interlayer insulation film provided around a lower conductor may become damaged. Such damage may cause the semiconductor device to operate with reduced reliability.

SUMMARY

Embodiments of the inventive concept provide semiconductor devices fabricated with greater precision and fewer fabrication faults. Embodiments of the inventive concept exhibit improved reliability, as inadvertent fabrication damage to collateral material layers and components is avoided or greatly reduced.

According to an aspect of the inventive concept, there is provided a semiconductor device including a lower conductor having a lower conductor sidewall, a barrier film having a barrier film sidewall formed directly on the lower conductor sidewall, and a via formed on a top surface of the lower conductor. A top portion of the barrier film sidewall is recessed, such that a top surface of the barrier film sidewall is at a level lower than the top surface of the lower conductor.

According to an aspect of the inventive concept, there is provided a semiconductor device including a first lower conductor having a first lower conductor sidewall, a second lower conductor having a second lower conductor sidewall, wherein the first lower conductor and the second lower conductor are disposed at a same metal layer of the semiconductor device, a first barrier film having a first barrier film sidewall formed directly on the first lower conductor sidewall, a second barrier film having a second barrier film sidewall formed directly on the second lower conductor sidewall, and a via formed on a top surface of the first lower conductor, wherein a top portion of the first barrier film sidewall is recessed, such that a top surface of the first barrier film sidewall is at a level lower than the top surface of the first lower conductor.

According to an aspect of the inventive concept, there is provided a method of fabricating a semiconductor device including forming a lower conductor having a lower conductor sidewall on a substrate, forming a barrier film having a barrier film sidewall formed directly on the lower conductor sidewall, wherein a combination of the lower conductor and barrier film are laterally surrounded by a first insulation layer, forming a second insulation layer on the first insulation layer, the lower conductor, and the barrier film, forming a third insulation layer on second first insulation layer, forming a via hole that extends through the third insulation layer and the second insulation layer to expose a top surface of the lower conductor and a top portion of the barrier film sidewall, recessing the exposed top portion of the barrier film sidewall, such that a top surface of the barrier film sidewall is at a level lower than the top surface of the lower conductor.

BRIEF DESCRIPTION OF THE DRAWINGS

The above and other features and advantages of the inventive concept will become more apparent to those skilled in the art upon consideration of certain embodiments described with reference to the attached drawings in which.

DETAILED DESCRIPTION

Advantages and features of the inventive concept and methods of accomplishing the same may be understood more readily by reference to the following detailed description of embodiments taken together with the accompanying drawings. The inventive concept may, however, be embodied in many different forms and should not be construed as being limited to only the illustrated embodiments. Rather, these embodiments are provided so that the disclosure will be thorough and complete and will fully convey the concept of the inventive concept to those skilled in the art. The scope of the inventive concept is defined by the following claims and equivalents thereof. Thus, in the description that follows certain well-known methods, procedures, components, and circuitry have not be described in detail to avoid unnecessary and potentially confusing detail.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, certain semiconductor device(s) according to an embodiment of the inventive concept will be described with reference to FIGS. 1, 2, 3, 4, and 5 (hereafter, FIGS. 1 through 5).

Figure 1:
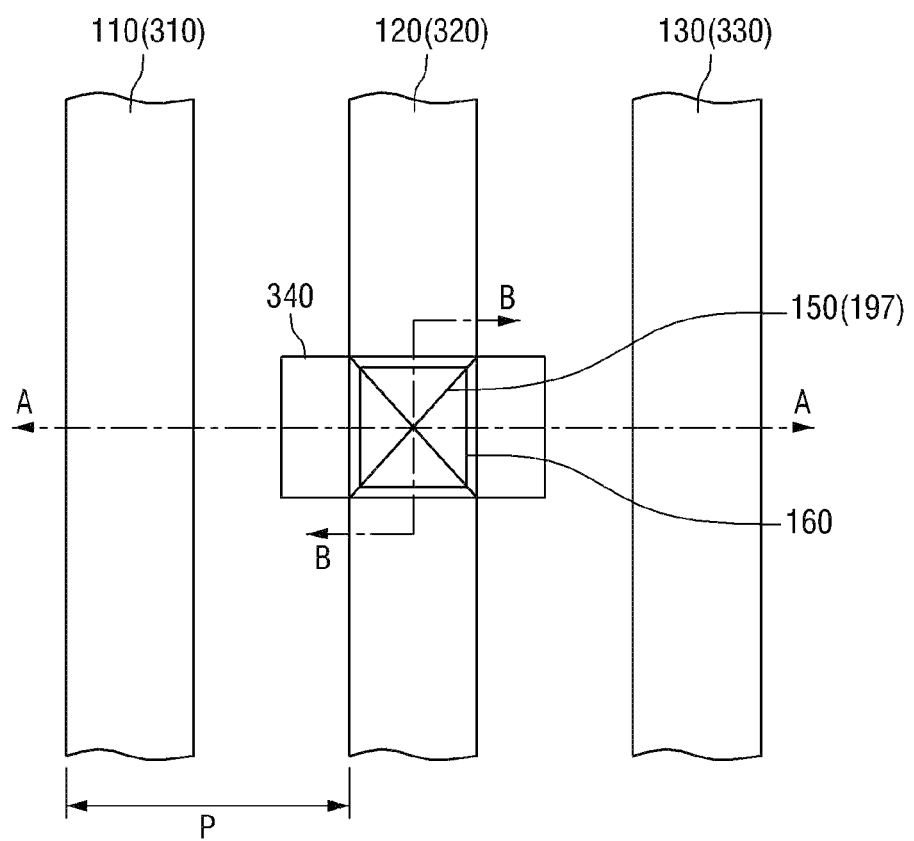
FIG. 1 is a partial layout diagram illustrating a semiconductor device according to an embodiment of the inventive concept.
Figure 2:
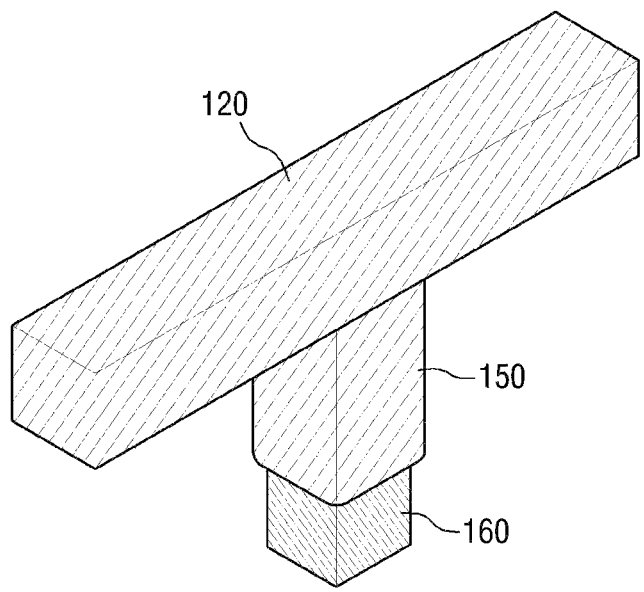
FIG. 2 is a partially perspective view further illustrating the semiconductor device of FIG. 1, and particularly illustrating a relationship between a first upper conductor, a first lower conductor and a via.
Figure 3:
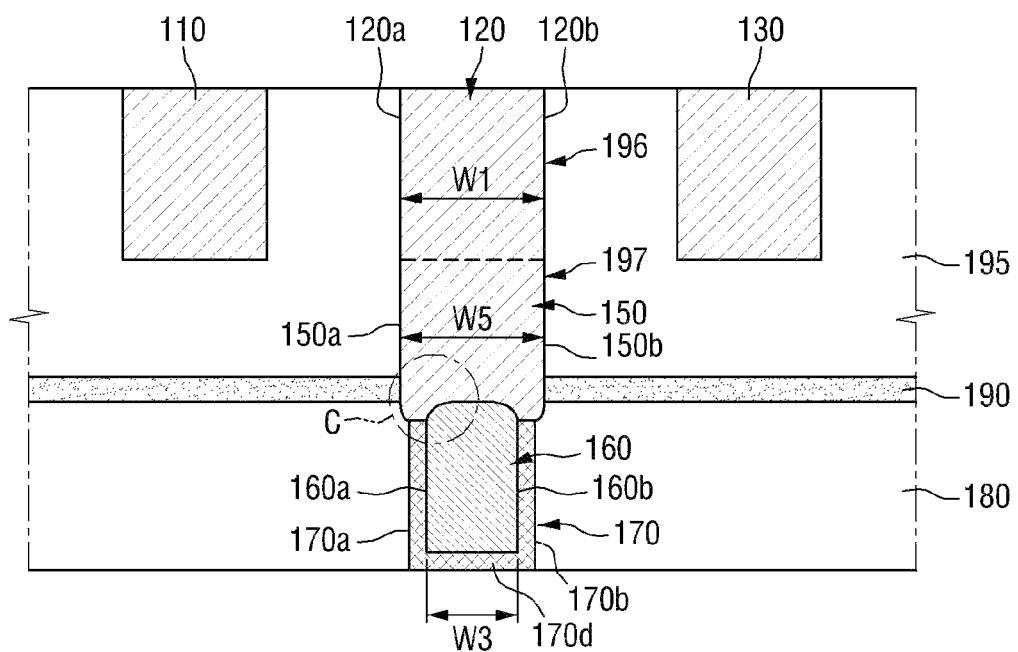
FIG. 3 is a cross-sectional view taken along the line A-A of FIG. 1.
Figure 4:
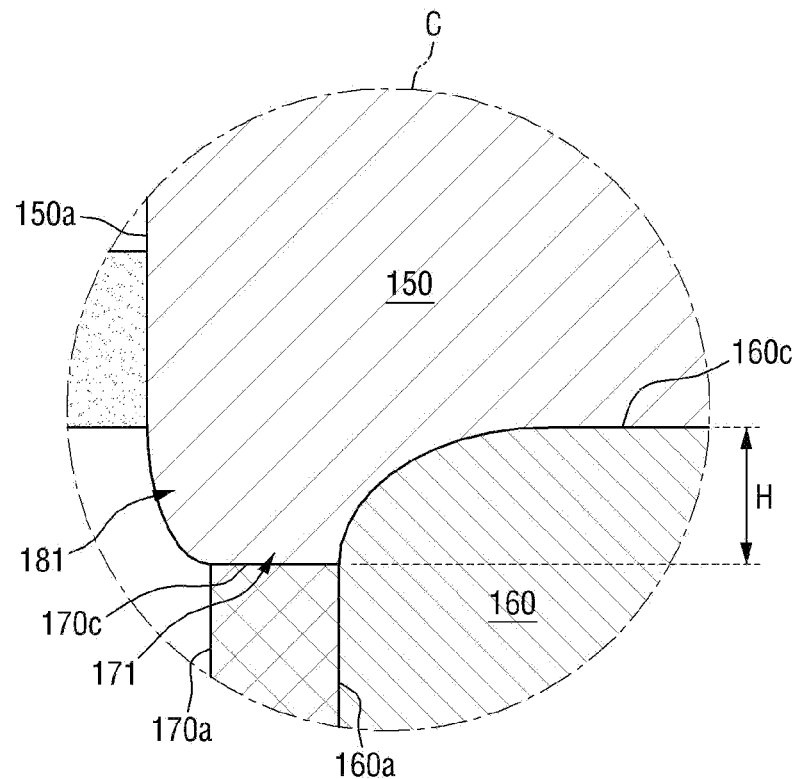
FIG. 4 is an enlarged view further illustrating the region portion 'C' denoted in FIG. 3.
Figure 5:
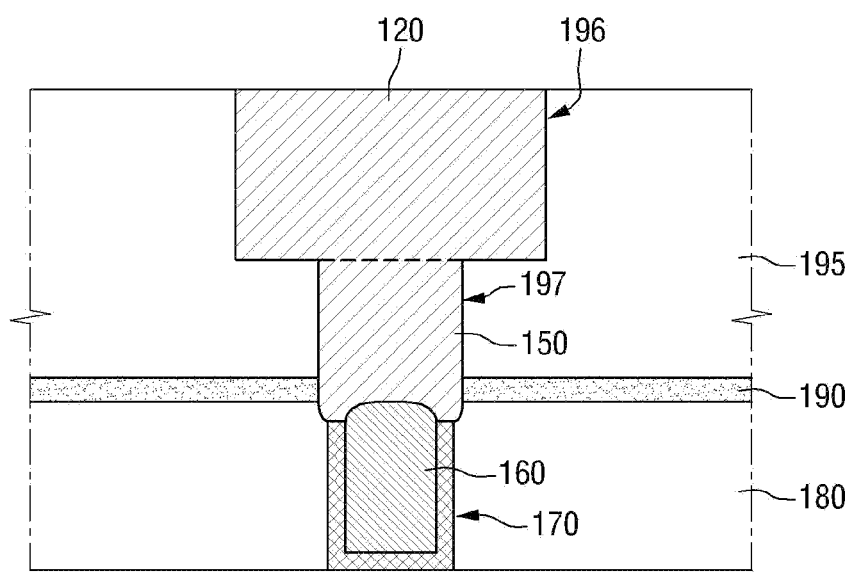
FIG. 5 is a cross-sectional view taken along the line B-B of FIG. 1.

FIG. 1 is a layout diagram illustrating a semiconductor device according to an embodiment of the inventive concept. FIG. 2 is a partial perspective view of the semiconductor device of FIG. 1 particularly illustrating structural relationships between a first upper conductor, a first lower conductor and a via. FIG. 3 is a cross-sectional view taken along the line A-A of FIG. 1. FIG. 4 is an enlarged view of the designated portion 'C' of FIG. 3. FIG. 5 is a cross-sectional view taken along the line B-B of FIG. 1.

Referring collectively to FIGS. 1 through 5, a semiconductor device 1 comprises a first upper conductor 120, a second upper conductor 110, a third upper conductor 130, a lower conductor 160, a barrier film 170, a via 150, a first insulation film 180, a second insulation film 190, and a third insulation film 195.

The first insulation film 180 surrounds the lower conductor 160 and the barrier film 170, but exposes upper surfaces of the lower conductor 160 and the barrier film 170. The second insulation film 190 may be formed on the first insulation film 180 as an etch stopper film useful during the formation of the via 150. The third insulation film 195 may be formed on the second insulation film 190 to surround (and electrically separate) the via 150, the first upper conductor 120, the second upper conductor 110 and the third upper conductor 130. In certain embodiments, the first insulation film 180, the second insulation film, and/or the third insulation film 195 may be formed from one or more materials such as $SiO_2$, SiN, SiON, SiCN, and low-k dielectric material(s), etc. However, those skilled in the art will understand that this is a matter of design choice and embodiments of the inventive concept are not strictly limited to these materials.

In certain embodiments of the inventive concept, the first upper conductor 120, the second upper conductor 110, and the third upper conductor 130 may be interconnections. As the illustrated in FIG. 1 the first upper conductor 120, the second upper conductor 110, and the third upper conductor 130 may be lateral running (e.g., the X direction) interconnections, but this is merely a selected example of many different "upper conductors" that may be used in a semiconductor device consistent with embodiments of the inventive concept. The first upper conductor 120, the second upper conductor 110, and the third upper conductor 130 may be characterized by a constant pitch (P), but this need not be the case in other embodiments. The pitch P will usually be very, very small—(e.g.,) in a range of between 10 nm and 100 nm.

In the illustrated example of FIG. 3, the via 150 serves to vertically interconnect the first upper conductor 120 with the lower conductor 160. That is to say, the via 150 may be "formed on" the lower conductor 160, and/or "formed under" the first upper conductor 120. In certain embodiments of the inventive concept, the via 150 will be a so-called "self-aligned via".

One fabricating method that may be used to form self-aligned vias will be described hereafter with reference to FIGS. 16 through 27. Using a self-aligned via fabricating method and referring to FIG. 3, a width "W1" of the first upper conductor 120 and a width "W5" of the via 150 may be substantially equal. That is to say, the width W1 of the first upper conductor 120 and the width W5 of the via 150 may be completely equal, or they may be somewhat different, depending on, for example, variations in processing conditions. In many embodiments it is highly desirable for the sidewalls 120a and 120b of the first upper conductor 120 and the sidewalls 150a and 150b of the via 150 to respectively match in accurate alignment as far as practically possible.

To this end, the first upper conductor 120 and the via 150 may be formed using a dual damascene method. That is to say, the first upper conductor 120 is a dual damascene interconnection, and the via 150 may be a dual damascene via.

In certain embodiments, the lower conductor 160 may be a contact or an interconnection. As shown in FIG. 3, the lower conductor 160 may be shaped of an island and may extend laterally. The lower conductor 160 may be formed from one or more conductive materials such as (e.g.,) aluminum, tungsten, etc. The lower conductor 160 will be formed having a first sidewall 160a and a second sidewall 160b.

Design rules are generally understood by those skilled in the art as defining and prescribing certain critical dimensions and/or dimensional relationships for a semiconductor device. One example of a critical dimension relationship is the relative size of a top surface of the lower conductor 160 in relation to a bottom surface of the via 150. For example, a design rule may require that a width "W3" of the lower conductor 160 must be less than the width W5 of the via 150.

Further in regard to the fabrication of the lower conductor 160, the bather film 170 may include a first sidewall 170a, a second sidewall 170b, and a bottom region 170d. The first sidewall 170a may be formed on the first sidewall 160a of the lower conductor 160, and the second region 170b may be formed on the second sidewall 160b of the lower conductor 160. The bottom region 170d may be formed under a bottom surface of the lower conductor 160. The bather film 170 may be formed from one or more materials including, for example, Ti and/or TiN. In certain embodiments, the barrier film 170 may have a stacked structure of Ti/TiN.

The lower conductor 160 is formed proximate a first recess 171 associated with the first sidewall 170a and similarly the second sidewall 170b. Relative to a top surface of the lower conductor 160, the first recess 171 may be formed (e.g.,) in certain embodiments to a depth in a range of between 60 Å and 100 Å. In one particular embodiment, the first recess 171 is formed to a depth of around 80 Å.

Thus, with particular reference to FIG. 4, the top surface 160c of the lower conductor 160 may extend upwards to a level higher than a top surface 170c of the first sidewall 170a and a top surface of the second sidewall 170b of the barrier film 170. It should be noted here that corner (or edge) portions of the top surface 160c of the lower conductor 160 may be rounded in shape as they extend in connection with the first sidewall 160a and second sidewall 160b of the lower conductor 160. Thus, a height difference "H" (or "height step") may exist between the respective top surfaces of the first sidewall 170a and the second sidewall 170b, and the top surface 160c of the lower conductor 160. This height step is essentially the first recess 171 formed proximate the boundary between the lower conductor 160 and the top surface of the barrier film layer 170.

In addition, the first insulation film 180 may include a second recess 181 formed in a portion of the first insulation film 180 proximate the first recess 171. As more particularly illustrated in FIG. 4, a "recessed region" including the first recess 171 and the second recess 181 may have a width that increases as the recessed region extends upward from the top surface 170c of the barrier film layer 170. The conductive material used to form the via 150 will fill both the first recess 171 and the second recess 181 of the recessed region.

In a case where the first recess 171 or the second recess 181 are not contiguously formed in the fabricated structure, a misalignment may occur during the subsequent formation of the via 150. For example, in a case where the first insulation film 180 is not properly formed along the entire vertical length of the first sidewall 170a (i.e., some hollow portion exists between the first insulation film 180 and the first sidewall 170a), a fang-shaped protrusion of the conductive material forming the via 150 may downwardly descend into the first insulation film 180 along an outer surface of the first sidewall 170a. This unwanted materials migration has the effect of altering (i.e., expanding) the critical width dimension of the lower conductor 160 to be potentially become larger than the width of the via 150.

Thus, it is possible for a descending, fang-shaped protrusion of conductive material to be formed in the first insulation film 180 even without some misalignment occurring during the formation of via. Such a fang-shaped protrusion may increase resistance between the lower conductor 160 and the via 150 beyond specifications.

In the semiconductor device illustrated in FIGS. 1 through 5, in order to prevent the generation of a descending fang-shaped protrusion into the first insulation film 180, a portion of the first sidewall 170a is selectively removed. That is to say, the first recess 171 is formed between the top surface 170c of the first sidewall 170a and the top surface 160C of the lower conductor 160. Accordingly, since the via 150 completely fills the first recess 171, a contact area between the lower conductor 160 and the via 150 is increased. As a result, resistance between the first lower conductor 160 and the via 150 may be reduced. In addition, the recessed region including the first recess 171 and the second recess 181 will "increase upwardly." That is, the width of the recessed region will increase as a function of level above the top surface 170c of the first sidewall 170a. Therefore, the via 150 will easily fill the entire recessed region including the first recess 171 and the second recess 181.

In addition, as shown in the illustrated example, the top surface 160c of the lower conductor 160 may be relatively "convex" in its shape (i.e., higher in its center relative to its peripheral edges). However, this description of the top surface 160c of the lower conductor 160 being "relatively convex" allows for a certain degree of flatness in the center portion and relatively more convex rounding (or curving) at the edge. By providing a relatively convex top surface 160c for the lower conductor 160, the contact area between the lower conductor 160 and the via 150 is increased. Therefore, the resistance between the lower conductor 160 and the via 150 may be reduced. And even if a small degree of misalignment occurs during the fabrication of the via 150, the resistance between the lower conductor 160 and the via 150 will not increase markedly. Therefore, resistance deviations between respective lower conductors 160 and corresponding vias 150 will not be large. As a result, the operating reliability for semiconductor devices according to embodiments of the inventive concept is very high.

Figure 6:
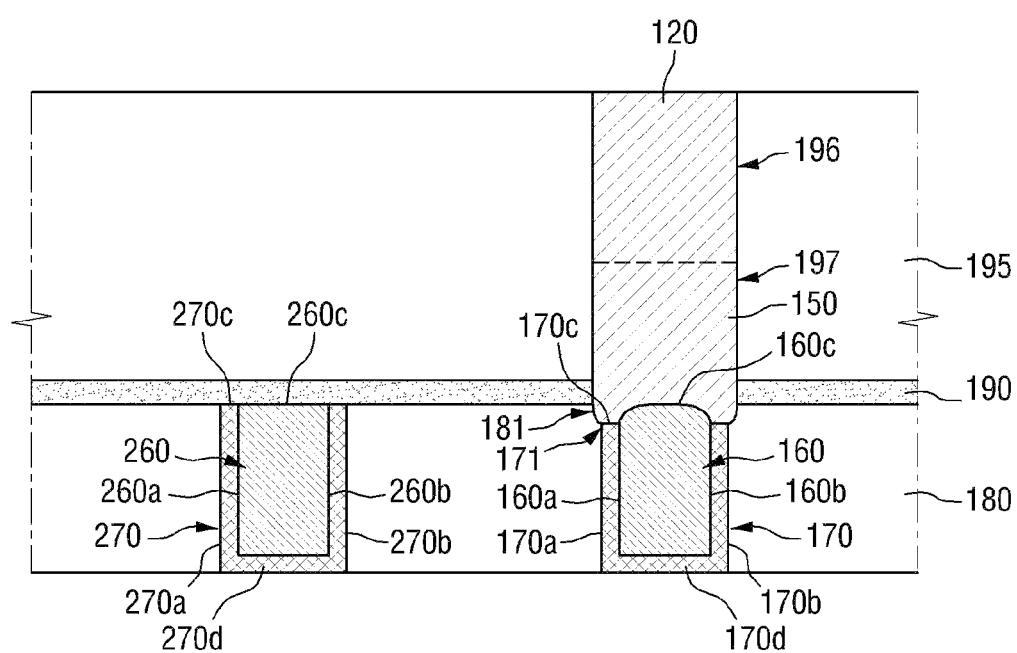
FIG. 6 is a cross-sectional view of a semiconductor device according to another embodiment of the inventive concept.

FIG. 6 is a cross-sectional view of a semiconductor device according to another embodiment of the inventive concept. For the sake of brevity, substantially similar components, regions, and elements will be similarly numbered or labeled as between respective illustrated embodiments.

Referring to FIG. 6, a semiconductor device 2 comprises a first lower conductor 160 and a second lower conductor 260 disposed adjacent to each other. As shown in FIG. 6, the first lower conductor 160 and the second lower conductor 260 may be substantially formed a same metal level within the overall structure of semiconductor device 2, may be formed from substantially the same material(s), and may be formed at the same time during fabrication.

As described above, the first lower conductor 160 comprises a first sidewall 160a and a second sidewall 260b, as well as the barrier film 170 formed around the first lower conductor 160.

The second lower conductor 260 may similarly comprise a third sidewall 260a and a fourth sidewall 260b, and a second barrier film 270 formed around the second lower conductor 260. That is to say, the second barrier film 270 include a third sidewall 270a formed on the third sidewall 260a of the second lower conductor 260, and a fourth sidewall 270b formed on the fourth sidewall 260b of the second lower conductor 260.

As before, the via 150 is formed on the first lower conductor 160. Since the first sidewall 170a (or second sidewall 170b) of the barrier film 170 is formed with the first recess 171 in place, the top surface 170c of the first sidewall 170a (or the second sidewall 170b) may be formed at a level lower than the top surface 160c of the first lower conductor 160. The first insulation film 180 is similarly formed with respective second recess(es) 181 formed proximate the first recess(es) 171. And therefore, a recessed region including both first recess 171 and second recess 181 may be formed with a width that is upwardly increasing, such that as before the via 150 will fill both first recess 171 and the second recess 181.

In contrast, a via is not be formed on the second lower conductor 260 of FIG. 6. Therefore, a top surface 270c of the third sidewall 270a of the second barrier film 270 and a similar top surface of the fourth sidewall 270b are at least equal in height (i.e., are formed at a same level or higher) as a top surface 260c of the second lower conductor 260. In the illustrated embodiment of FIG. 6, the top surface 270c of the third sidewall 270a and the top surface of the fourth sidewall 270b are equal in height to the top surface 260c of the second lower conductor 260.

Further in regard to the embodiment of FIG. 6, the top surface 160c of the first lower conductor 160 may be at a height that is less than or equal the top surface 260 of the second lower conductor 260.

After formation of a via hole 197 (described hereafter), the first recess 171 and second recess 181 may be formed by etching of the top surface 170c of the first sidewall 170a (and/or the second sidewall 170b) as exposed by the via hole 197. Thus, since the second lower conductor 260 is not connected to the via 150, no such recesses will be formed on the corresponding top surface 270c of the third sidewall 270a (or fourth sidewall 270b) of the second bather film 270.

As already noted, the top surface 160c of the first lower conductor 160 may be relatively convex, whereas the top surface 260c of the second lower conductor 260 may be completely planar.

Figure 7:
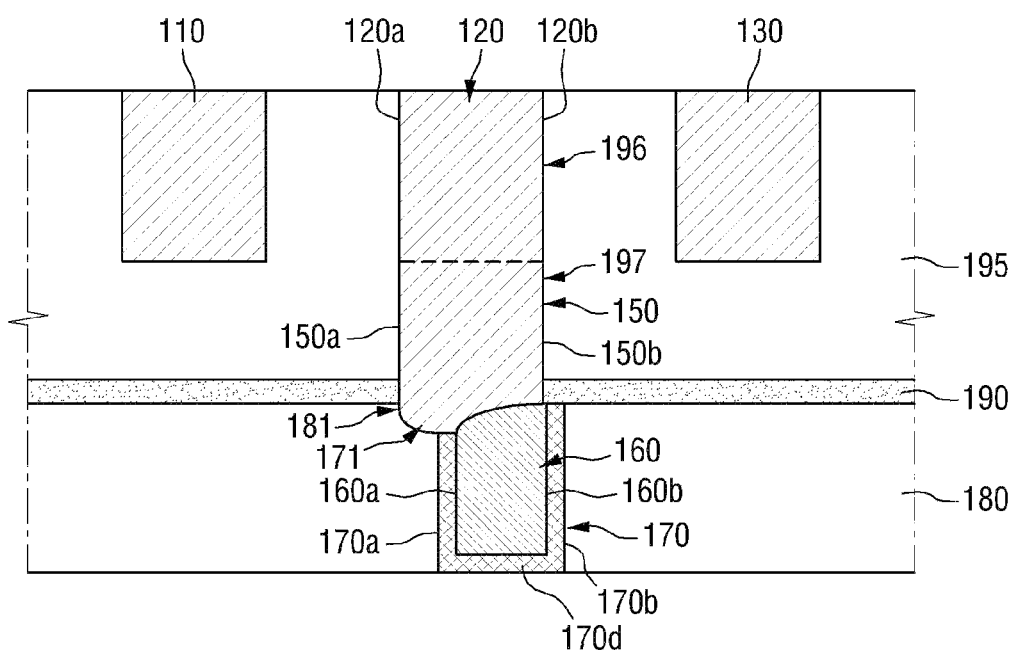
FIG. 7 is a cross-sectional view of a semiconductor device according to still another embodiment of the inventive concept.

FIG. 7 is a cross-sectional view of a semiconductor device according to still another embodiment of the inventive concept.

Referring to FIG. 7, a semiconductor device 3 comprises the lower conductor 160 and the via 150. However, these two elements are substantially misaligned, as compared with the previously described embodiments. That is to say, as shown in FIG. 7, the via 150 is formed to overlay only the one side of lower conductor 160 including the first sidewall 170a, whereas at some portion of the second sidewall 170b is "not covered by" the via 150 due to the misalignment of the lower conductor 160 and the via 150.

However, the first sidewall 170a of the barrier film 170 is formed in a stepped down manner with the first recess 171 relative to the top surface of the lower conductor 160. In contrast, the top surface of the second sidewall 170b of the barrier film 170 does not include a first recess but has a top surface height at least equal to the top surface of the lower conductor 160. This different formation is in and of itself a function of the unintended misalignment without the context of embodiments of the inventive concept.

Thus structural difference arises because after forming the via hole 197, the first recess 171 may be readily formed in the via hole 197 by selectively etching a portion of the barrier film 170 exposed by the via hole 197. Here, the first sidewall 170a of the barrier film 170 is exposed by the via hole 197, but the second sidewall 170b is not exposed by the via hole 197. Therefore, a first recess 171 will be formed in relation to the exposed first sidewall 170a while no first recess will be formed in the unexposed second sidewall 170b. As a result, the top surface of the second sidewall 170b of the barrier film 170 remains un-etched and will have a height at least equal to the top surface of the lower conductor 160.

Figure 8:
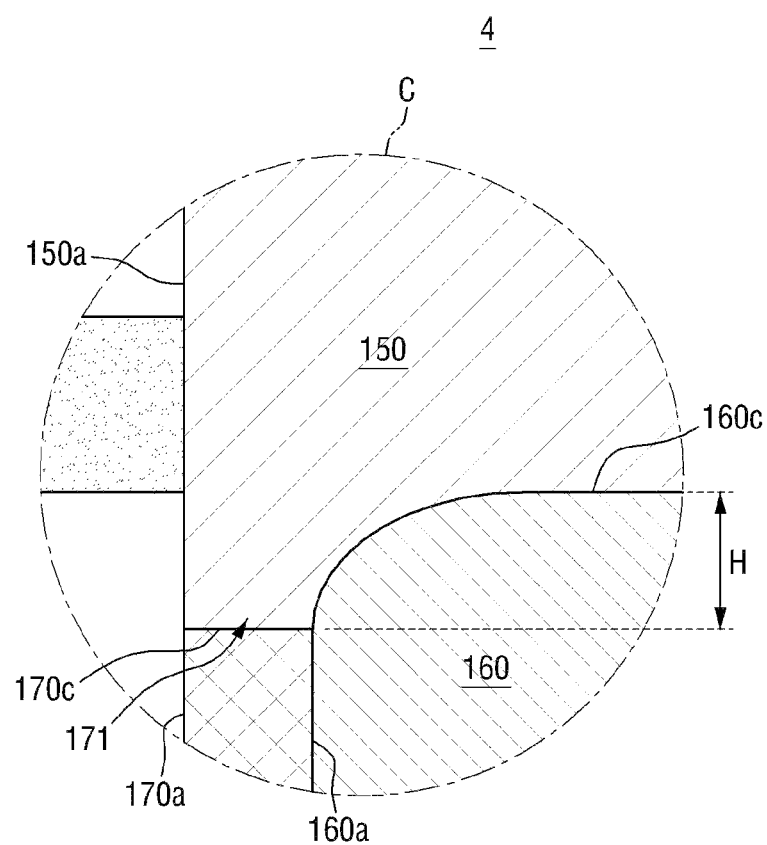
FIG. 8 is a partial cross-sectional view of a semiconductor device according to yet another embodiment of the inventive concept.

FIG. 8 is a cross-sectional view of a semiconductor device according to a still another embodiment of the inventive concept.

Referring to FIG. 8, a semiconductor device 4, in part, comprises the first sidewall 170a of the barrier film 170 being formed with the first recess 171 as described above. Hence, the height of the top surface 170c of the first sidewall 170a will be lower than the top surface 160c of the lower conductor 160. However, different from the preceding illustrated embodiments, no second recess (181 of FIG. 4) is formed proximate the first recess 171 in the first insulation film 180, for example.

Figure 9:
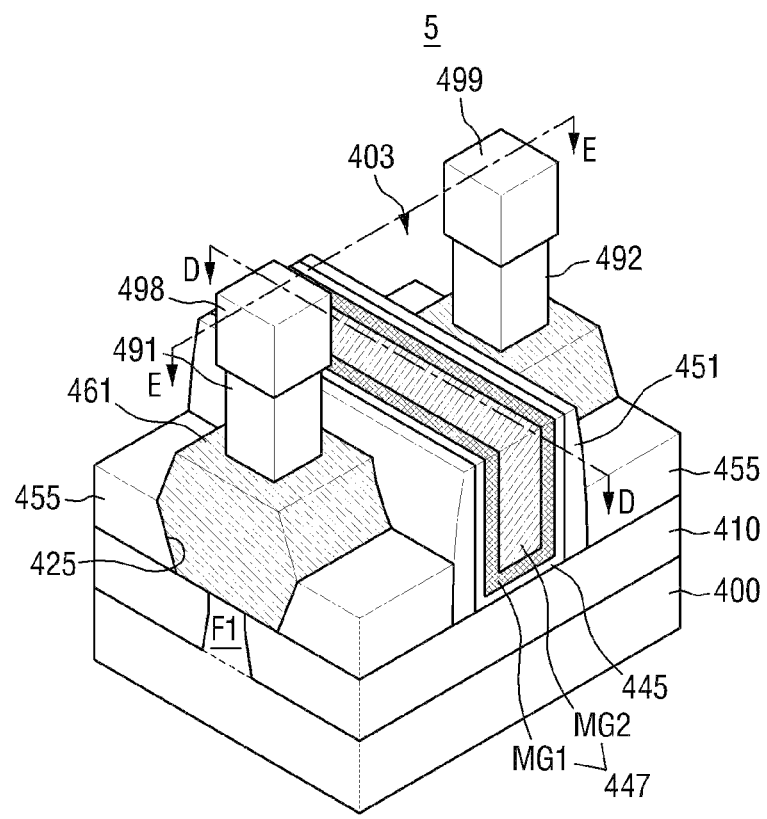
FIG. 9 is a perspective view of a semiconductor device according to yet another embodiment of the inventive concept.
Figure 10:
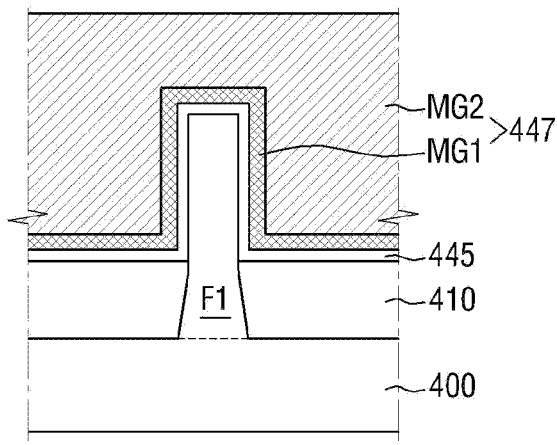
FIG. 10 is a cross-sectional view taken along the line D-D of FIG. 9.

FIG. 9 is a perspective view illustrating a semiconductor device according to still another embodiment of the inventive concept. FIG. 10 is a cross-sectional view taken along line D-D of FIG. 9, and FIG. 11 is a cross-sectional view taken along line E-E of FIG. 9.

Figure 11:
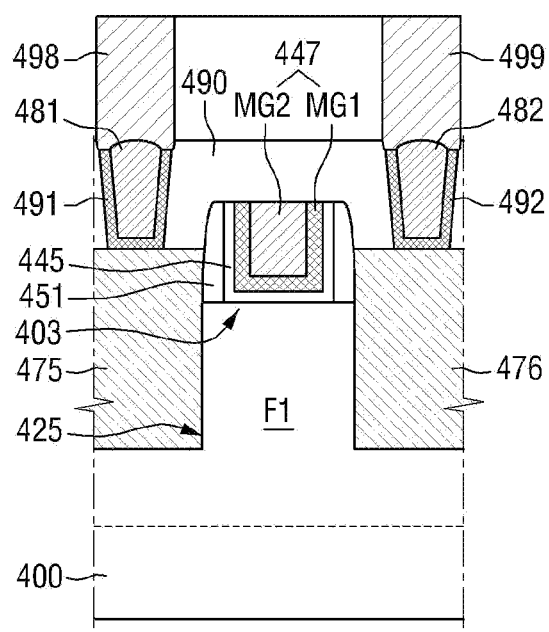
FIG. 11 is a cross-sectional view taken along the line E-E of FIG. 9.

Referring collectively to FIGS. 9, 10 and 11, a semiconductor device 5 comprises a fin type transistor 403 including a fin structure F1, a gate electrode 447, a recess 425, and source/drain regions 475/476.

The fin F1 extends laterally in a second direction (Y1). The fin F1 may be a portion of a substrate 401 and may include an epitaxial layer grown from the substrate 401. A device isolation film 410 covers the laterally extending surfaces of the fin F1.

The gate electrode 447 may be formed to cross the Fin F1 by extending (e.g.,) in a first direction (X1).

In the illustrated embodiment of the FIG. 9, the gate electrode 447 may comprise a stacked structure including two or more metal layers (e.g.,) MG1 and MG2. The first metal layer MG1 adjusts a work function, and the second metal layer MG2 fills a space formed by the first metal layer MG1. The first metal layer MG1 may be formed from one or more metals including for example TiN, TaN, TiC, and TaC. The second metal layer MG2 may be formed from one or more metals including for example tungsten (W) and/or aluminum (Al). The gate electrode 447 may further include a non-metal material, for example, Si or SiGe. The gate electrode 447 may be formed by, for example, a replacement process, but those skilled in the art understand alternatives to these particular fabrication possibilities for other embodiments of the inventive concept.

The gate insulation film 445 may be formed between the Fin F1 and the gate electrode 447. The gate insulation film 445 may be formed on a top surface and an upper portion of the lateral surface of the fin F1. In addition, the gate insulation film 445 may be positioned between the gate electrode 447 and the device isolation film 410. The gate insulation film 445 may be formed from a high-k dielectric material having a higher dielectric constant than a silicon oxide film. For example, the gate insulation film 445 may include $HfO_2$, $ZrO_2$ or $Ta_2O_5$.

The recess 425 may be formed in the Fin F1 at either side of the gate electrode 447. Since a sidewall of the recess 425 is tilted, the recess 425 may be shaped such that its width increases away from the substrate 400. The width of the recess 425 may be larger than that of the fin F1.

The source/drain regions 475/476 may be formed in the recess 425. The source/drain regions 475/476 may thus be so-called elevated source/drain regions. That is to say, top surfaces for the source/drain regions 475/476 may be at a level higher than a bottom surface of the first interlayer insulation film 155. The source/drain regions 475/476 and the gate electrode 447 may be insulated from one another by a provided spacer 151.

Assuming that the fin type transistor 403 is a PMOS transistor, the source/drain 475/476 regions may include a compressive stress material. For example, the compressive stress material may be a material having a greater lattice constant than silicon (Si), for example, SiGe. The compressive stress material may apply a compressive stress to the fin F1, thereby improving mobility of carriers in a channel region.

The spacer 151 may include at least one of a nitride film and an oxynitride film.

An interlayer insulation film 465 may be formed on the substrate 400 to cover a fin type transistor 403, a plurality of contacts 481 and 482, and barrier films 491 and 492. The interlayer insulation film 465 may be formed from SiN or $SiO_2$, for example.

Here, each one of the plurality of contacts 481 and 482 may correspond to the lower conductor 160 (or first lower conductor 160) described above in relation to FIGS. 1 through 8. The barrier films 491 and 492 may be formed to surround the contacts 481 and 482. The barrier films 491 and 492 may respectively correspond to the barrier film 170 described above in relation to FIGS. 1 through 8. The vias 498 and 499 may be formed on the contacts 481 and 482. Thus, the vias 498 and 499 may correspond to the via 150 described above in relation to FIGS. 1 through 8.

Figure 12:
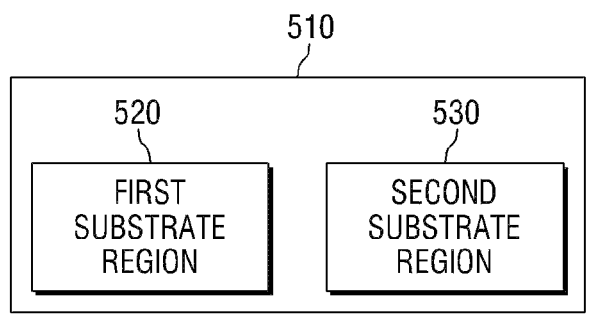
FIG. 12 is a general layout diagram illustrating a semiconductor device according to a still another embodiment of the inventive concept.

FIG. 12 is a general layout diagram illustrating a semiconductor device according to a yet another embodiment of the inventive concept.

Referring to FIG. 12, a semiconductor device 6 comprises a first substrate region 520 and a second substrate region 530 respectively defined on a substrate 510. For example, the first substrate region 520 may be a region wherein static random access memory (SRAM) cells are formed, while the second substrate region 530 may be region wherein logic circuits accessing the SRAM cells are formed. Alternatively, the first substrate region 520 may be used during the fabrication of SRAM and related logic circuit, while the second substrate region 530 is used to fabricate input/output (I/O) circuitry.

Lower conductor(s), barrier film(s) and connecting via(s), such as those described above in relation to FIGS. 1 through 8 may be fabricated in the first substrate region 520. That is to say, a bottom CD of a via may be smaller than a top CD of a corresponding lower conductor. In addition, since a first sidewall of the barrier film includes a first recess, the top surface of the first sidewall will be at a level lower than that of a top surface of the lower conductor.

In contrast, barrier film(s) surrounding lower conductor(s) formed in the second substrate region 530 need not include this type of first recess and top surface height differential. That is to say, the height of the top surface of the barrier film may be at a level at least equal to the height of the top surface of the lower conductor.

Figure 13:
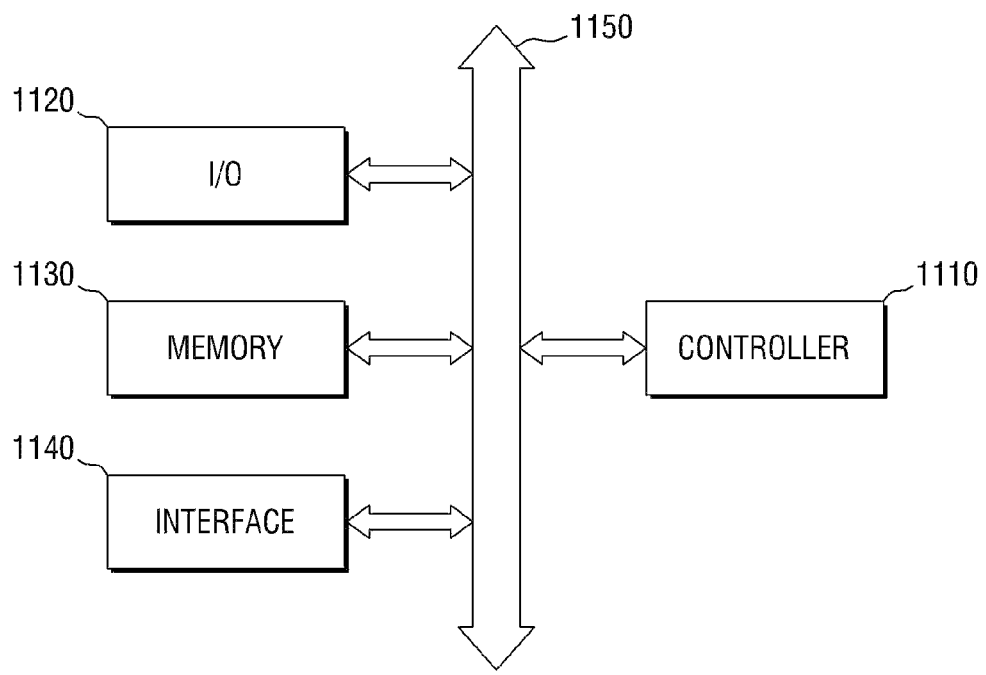
FIG. 13 is a block diagram of an electronic system that may incorporate a semiconductor device according to an embodiment of the inventive concept.

FIG. 13 is a block diagram of an electronic system that may incorporate a semiconductor device according to an embodiment of the inventive concept.

Referring to FIG. 13, an electronic system 1100 comprises a controller 1110, an input/output (I/O) device 1120, a memory device 1130, an interface 1140 and a bus 1150. The controller 1110, the I/O device 1120, the memory device 1130 and/or the interface 1140 may be connected to each other through the bus 1150. The bus 1150 may be used to communicate data, control, and/or address signals.

The controller 1110 may include at least one of a microprocessor, a digital signal processor, a microcontroller, and logic devices capable of performing similar functions to those performed by these devices. The I/O device 1120 may include a keypad, a keyboard, a display device, and the like. The memory device 1130 may store data and/or instructions. The interface 1140 may transmit/receive data to/from a communication network. The interface 1140 may be wired or wireless. For example, the interface 1140 may include an antenna or a wired/wireless transceiver. Although not shown, the electronic system 1100 may be used as an operating memory for improving the operation of the controller 1110 and may further include a high-speed DRAM and/or SRAM. The fin-type transistor according to embodiments of the present inventive concept may be provided within the memory device 1130 or may be provided as a component of the controller 1110 or the I/O device 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 14:
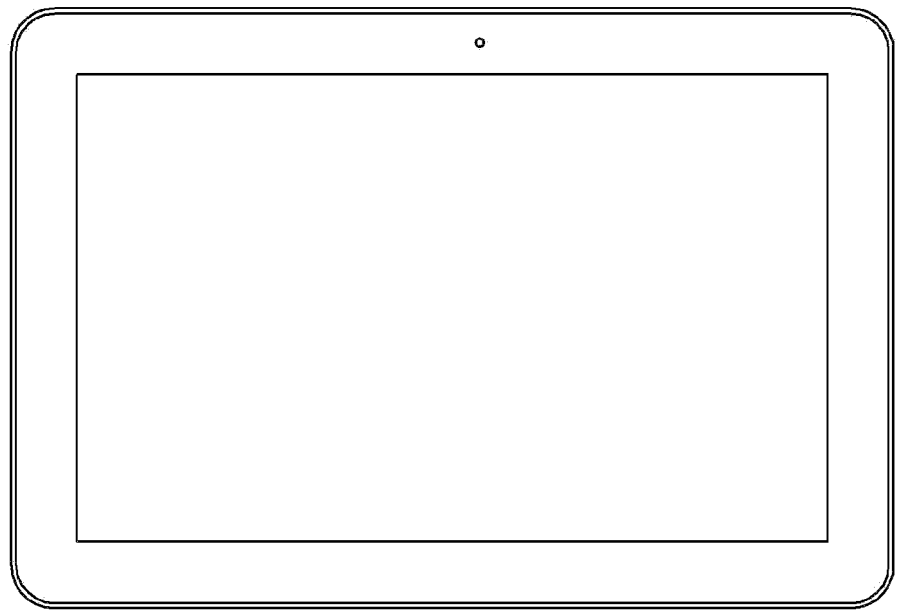
FIGS. 14 and 15 collectively illustrate an electronic system that may incorporate a semiconductor device according to an embodiment of the inventive concept.
Figure 15:
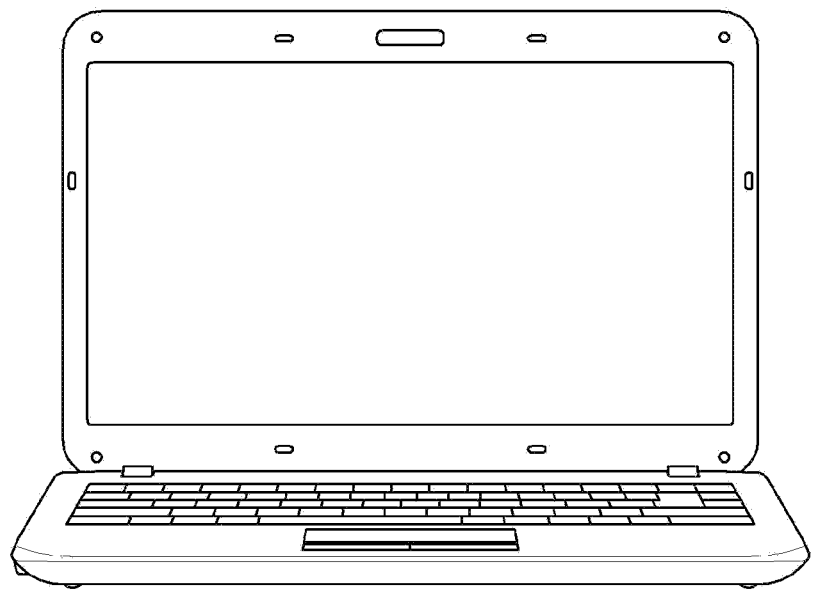

FIGS. 14 and 15 illustrate an electronic system that may incorporate a semiconductor device according to an embodiment of the inventive concept. Specifically, FIG. 14 illustrates a tablet PC and FIG. 15 illustrates a notebook computer. At least one semiconductor device like the ones described above in relation to FIG. 1 through 6 may be incorporated in a tablet PC, a notebook computer, and so on.

Hereinafter, one example of a fabricating method for a semiconductor device according to certain embodiments of the inventive concept will now be described with collective reference to FIGS. 16 through 27, as well as FIGS. 1 through 5.

More particularly, FIGS. 16 through 27 illustrate various intermediate processing steps for a fabricating method of a semiconductor device according to embodiments of the inventive concept. FIGS. 17, 22, 24 and 26 are cross-sectional views taken along line A-A of FIG. 16. FIGS. 18, 23, 25 and 27 are cross-sectional views taken along line B-B of FIG. 16.

Figure 16:
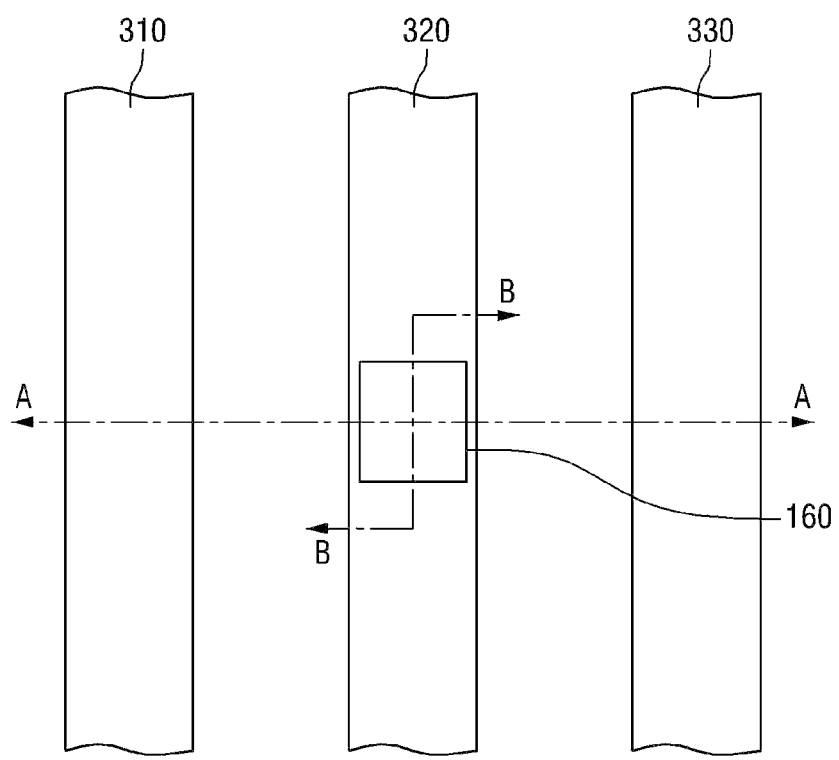
FIGS. 16, 17, 18, 19, 20, 21, 22, 23, 24, 25, 26, and 27 (hereafter, FIGS. 16 through 27) are respective diagrams illustrating certain intermediate processing steps that may be used during a fabricating method according to certain embodiments of the inventive concept.
Figure 17:
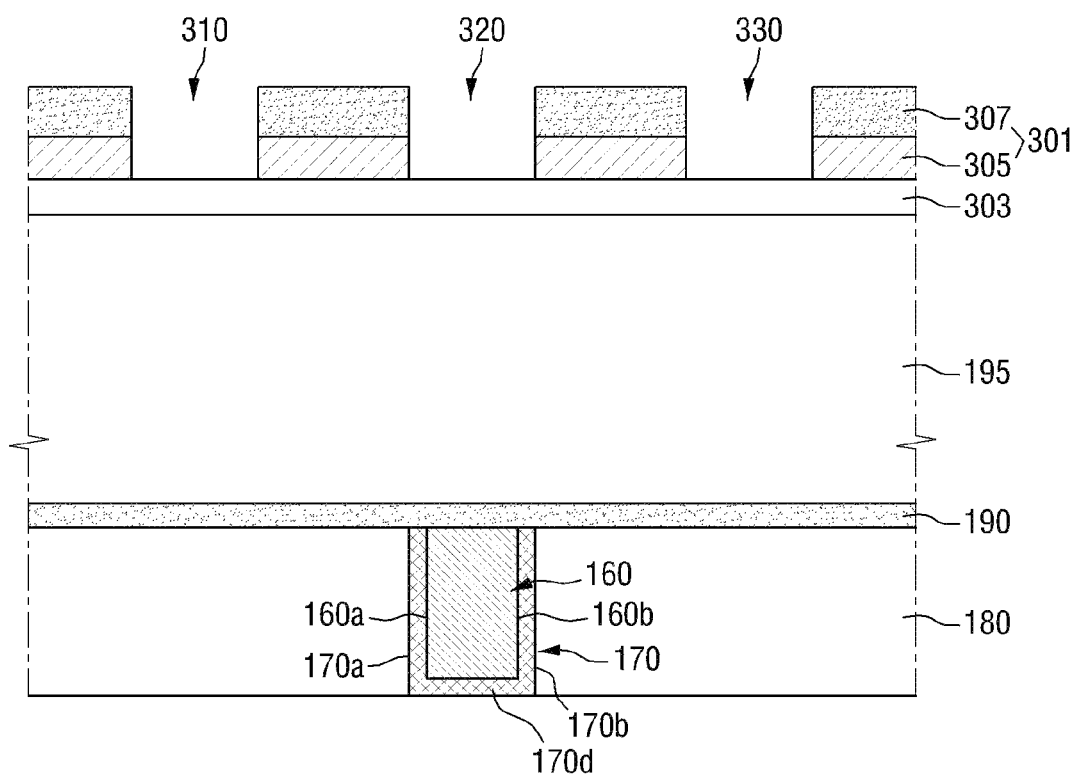
Figure 18:
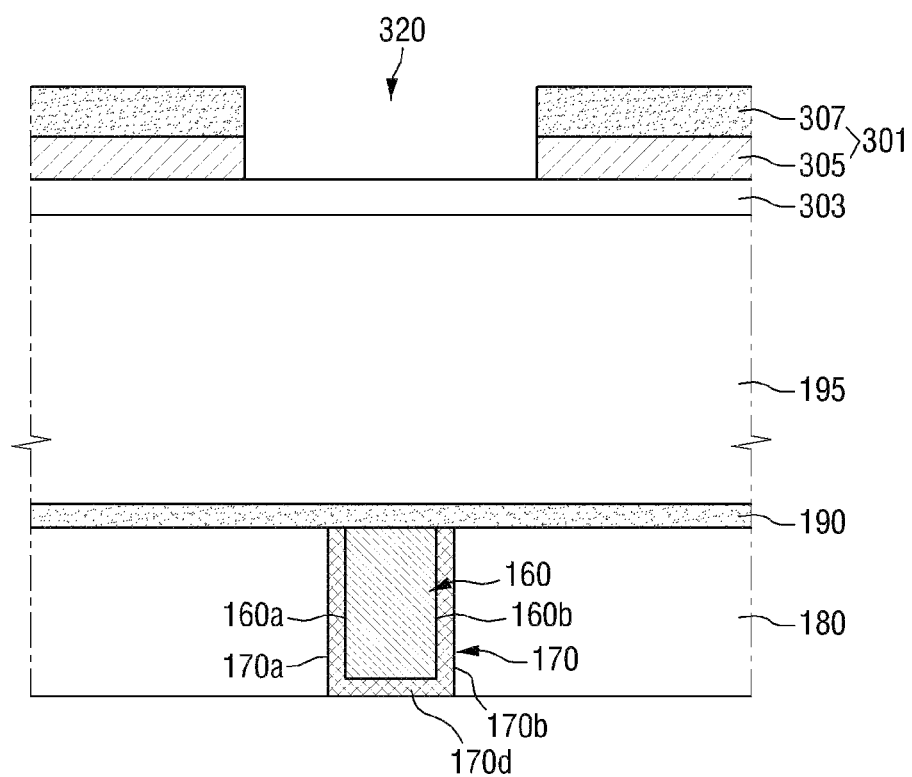

Referring to FIGS. 16, 17 and 18, the lower conductor 160 and barrier film 170 are formed on the substrate. The first insulation film 180 exposing top surfaces of the first lower conductor 160 and the barrier film 170 is formed surrounding this combination of these two elements.

That is, the lower conductor 160 may be formed from (e.g.,) aluminum (Al) or tungsten (W), for example. The lower conductor 160 includes the first sidewall 160a and the second sidewall 160b. The barrier film 170 includes the first sidewall 170a, second sidewall 170b, and bottom region 170d. The first sidewall 170a is formed on the first sidewall 160a of the lower conductor 160, and the second sidewall 170b is formed on the second sidewall 160b of the lower conductor 160. The bottom region 170d is formed on the bottom surface of the lower conductor 160. The barrier film 170 may be formed from one or more materials such as Ti and/or TiN, for example. The barrier film 170 may be implemented using a stacked film of Ti/TiN in certain embodiments. The first insulation film 180 may be formed from SiO$_2$, SiN, SiON, SiCN, and/or a low-k dielectric material, for example.

Subsequently, the second insulation film 190 and the third insulation film 195 may be formed on the lower conductor 160, the barrier film 170 and first insulation film 180. The second insulation film 190 may be formed from SiCN, for example, and the third insulation film 195 may be formed from a low-k dielectric material.

Next, an etch stopper film 303 and a hard mask pattern 301 including first openings 310, (e.g.,) 320 and 330 are formed on the third insulation film 195.

That is, the hard mask pattern 301 may include a metal hard mask pattern 305 and an insulating hard mask pattern 307, sequentially stacked. For example, the metal hard mask pattern 305 may include at least one of TiN, Ta and TaN, and the insulating hard mask pattern 307 may include at least one of SiO$_2$, SiN, SiON, and SiCN.

The metal hard mask pattern 305 has a high etching selectivity. For example, an etching selectivity of the metal hard mask pattern 305 to the third insulation film 195 (that is, a low-k dielectric material) may be 1:20 or higher. The use of the metal hard mask pattern 305 having such a high etching selectivity makes it possible to accurately maintain/adjust the width of a via hole (e.g., 197 of FIG. 3).

When the via hole 197 is formed using the metal hard mask pattern 305, a metallic polymer may be generated. Here, the insulating hard mask pattern 307 may reduce generation of the metallic polymer. If the metal hard mask pattern 305 is used alone without using the insulating hard mask pattern 307, the metallic polymer is generated from the metal hard mask pattern 305 to then be deposited around the via hole 197, and it is quite difficult to thereafter remove the deposited metallic polymer.

In addition, the use of the insulating hard mask pattern 307 reduces an amount of the metallic polymer dropping on the bottom of the via hole 197, thereby improving a bottom profile of the via hole 197.

Figure 22:
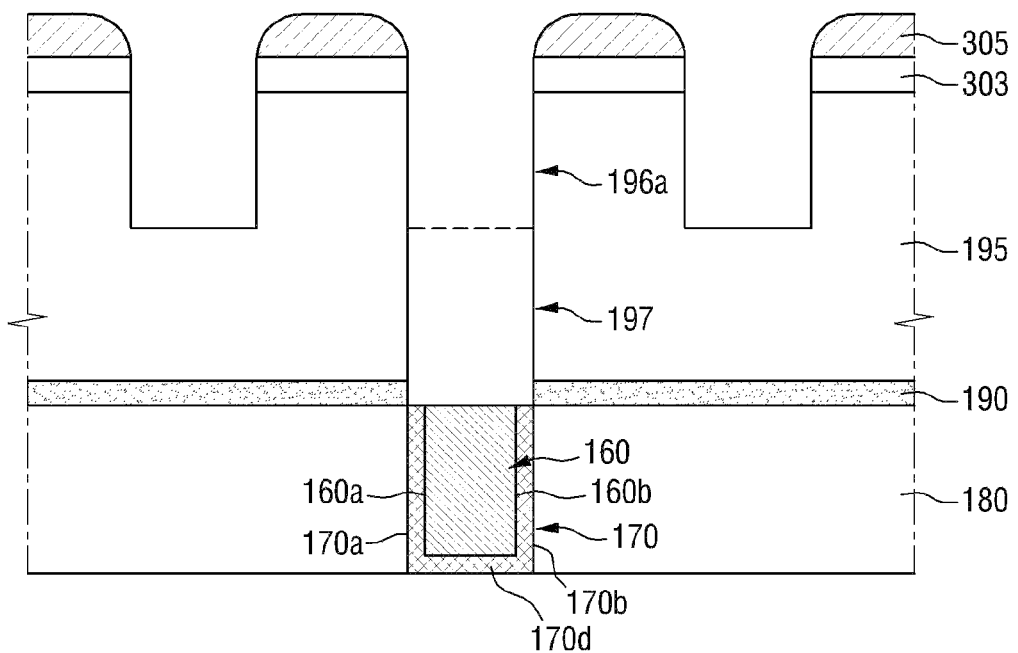
Figure 23:
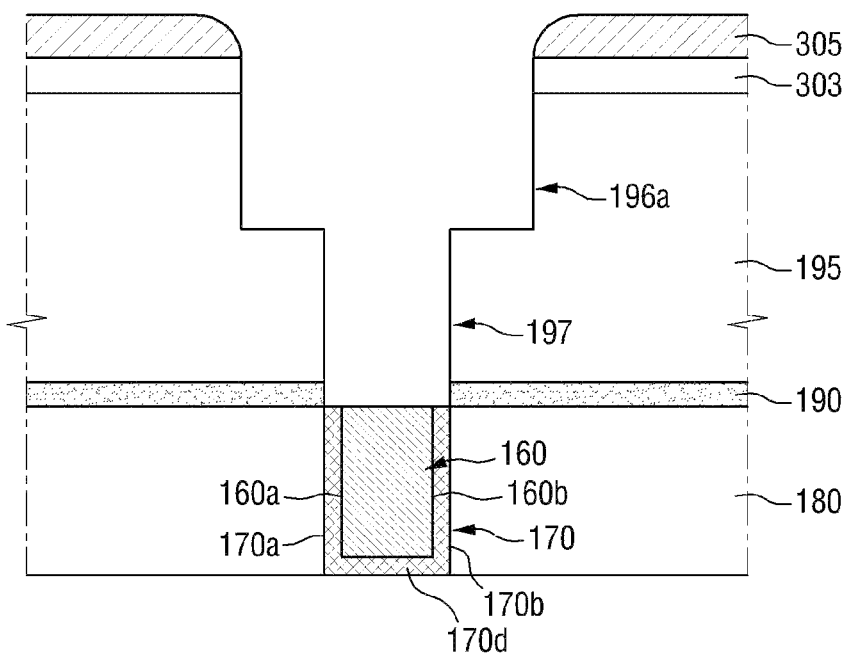

The insulating hard mask pattern 307 may be formed to a thickness sufficient to be completely removed during a step of forming a partial trench (see FIGS. 22 and 23). For example, the insulating hard mask pattern 307 may be formed to a thickness in a range of between 350 Å to 450 Å, and the metal hard mask pattern 305 may be formed to a thickness in a range of 250 Å to 350 Å, but embodiments of the inventive concept are not limited thereto. The use of the insulating hard mask pattern 307 may reduce the thickness of the metal hard mask pattern 305.

Figure 19:
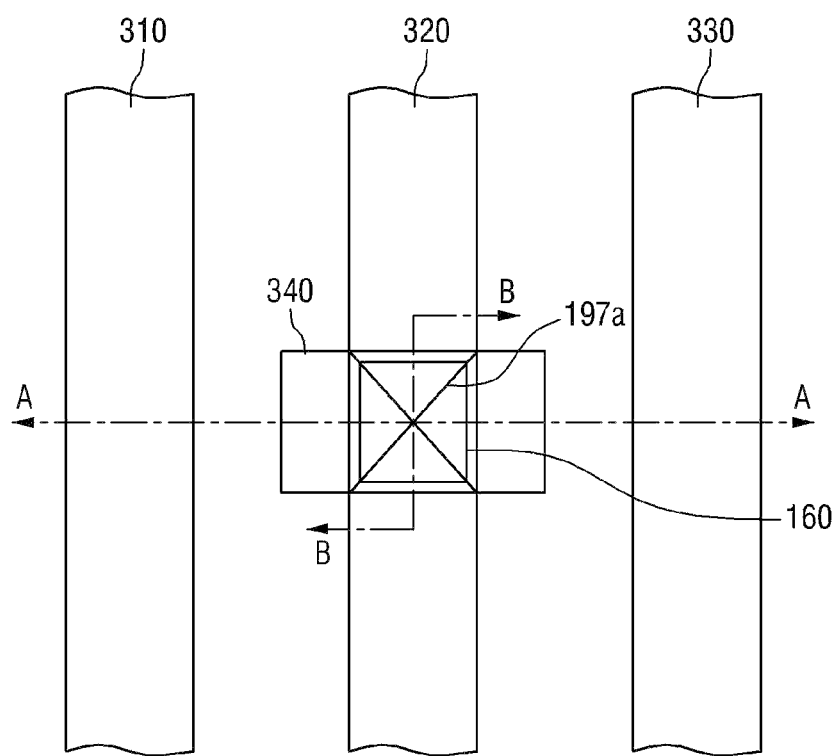
Figure 20:
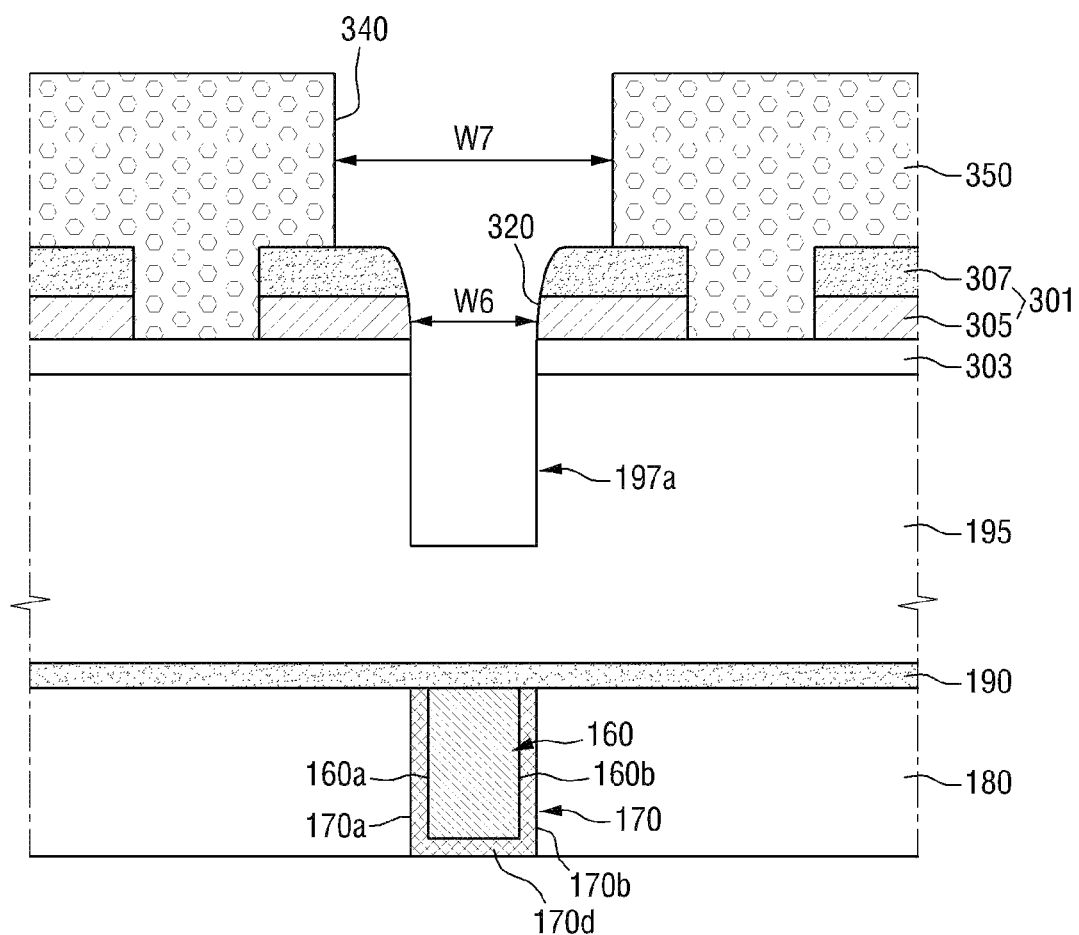
Figure 21:
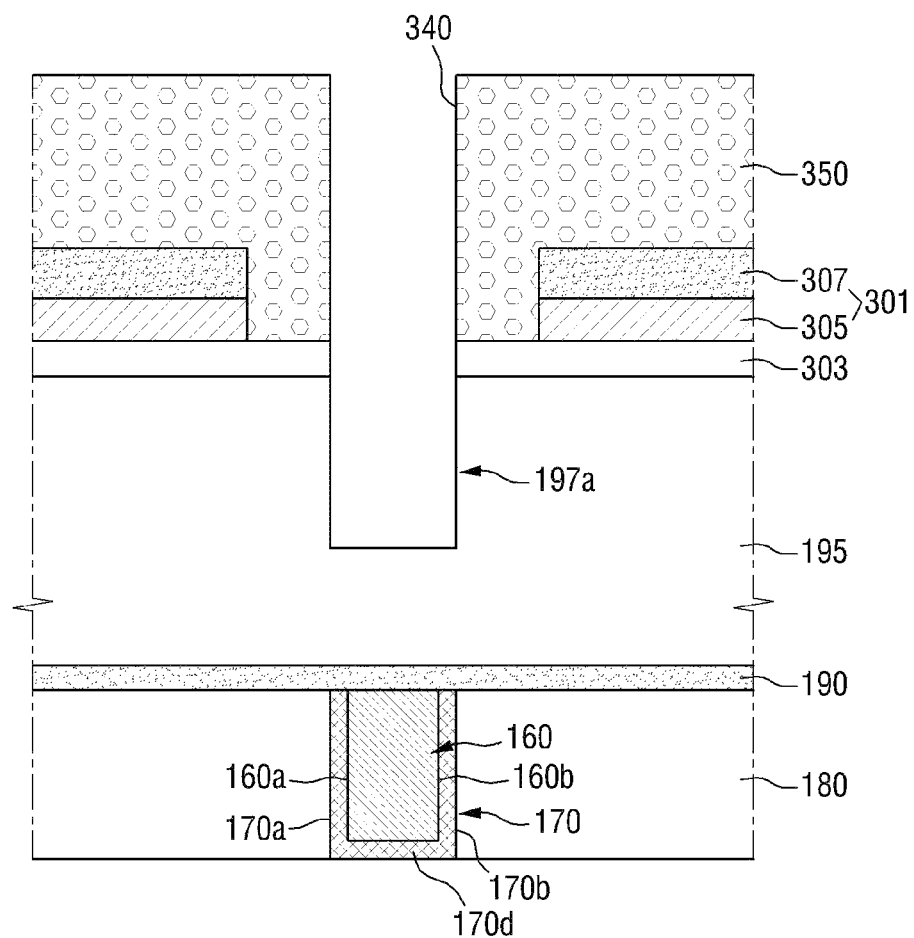

Referring now to FIGS. 19, 20 and 21, a mask pattern 350 including a second opening 340 is formed on the hard mask pattern 301. Here, the mask pattern 350 may be, for example, a photoresist pattern.

In particular, as shown in FIG. 20, the width "W6" of the first opening 320 may be less than the width "W7" of the second opening 340.

Subsequently, a via hole (a partial via hole) 197a may be formed in the second insulation film 195 using the mask pattern 350 and the hard mask pattern 301. That is to say, the partial via hole 197a does not expose the top surface of the lower conductor 160. As shown in FIG. 20, the partial via hole 197a may not even expose the top surface of the second insulation film 190. The partial via hole 197a may be formed by dry etching, for example. While the via hole 197a is formed, a portion of the insulating hard mask pattern 307 may also be etched. As shown, the insulating hard mask pattern 307 may have a chamfered or round shape as a result.

Referring to FIGS. 22 and 23, the mask pattern 350 is removed using an ashing process.

Subsequently, a portion of the second insulation film 195 is etched using the hard mask pattern 301, thereby exposing the top surfaces of the lower conductor 160 and barrier film 170. Here, a partial trench 196a may be formed in the second insulation film 195 while exposing the lower conductor 160 and the barrier film 170. The partial trench 196a may be formed by dry etching, for example. While the partial trench 196a is formed, the insulating hard mask pattern 307 may be entirely etched and the metal hard mask pattern 305 may be partially etched. As shown, the metal hard mask pattern 305 may have a chamfered or round shape as a result.

Figure 24:
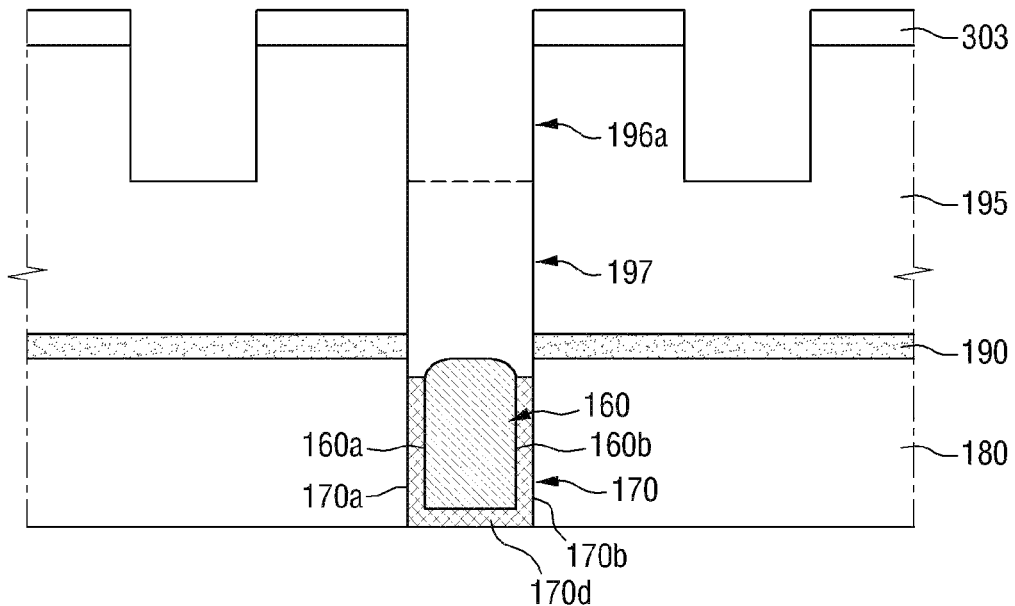
Figure 25:
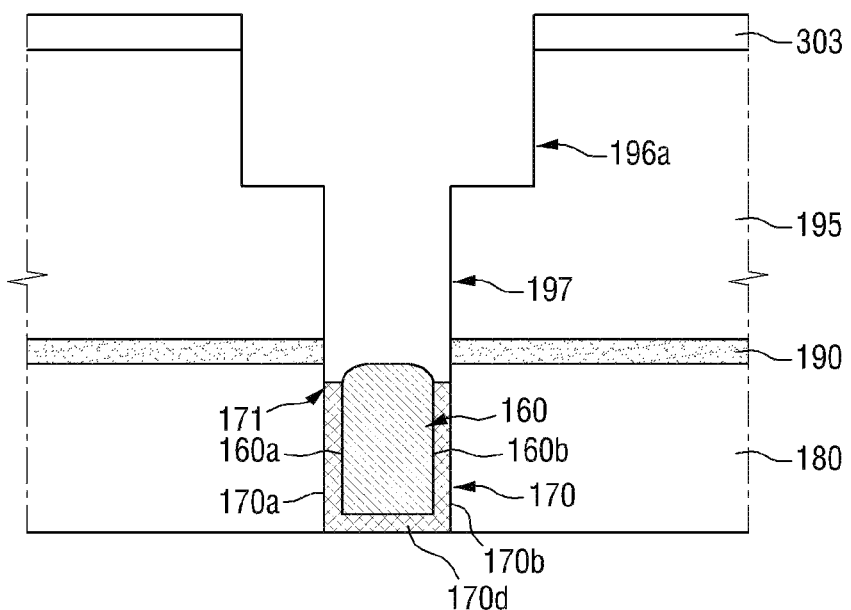

Referring to FIGS. 24 and 25, a portion of the exposed barrier film 170 is now etched, thereby forming the first recess 171 of the barrier film 170.

That is, the first recess 171 may be formed by dry etching, for example, because if wet etching is employed in the formation of the first recess 171, an etchant solution may penetrate the first sidewall 170a and second sidewall 170b of the barrier film 170 and partially or entirely remove these first regions. This will deteriorate the reliability of the resulting semiconductor device. Therefore, dry etching should be employed so as to remove only desired upper portions of the first sidewall 170a and second sidewall 170b.

In certain embodiments, the first recess 171 will be formed to a depth of 60 Å to 100 Å, and in one particular embodiment to a depth of about 80 Å.

The barrier film 170 and metal hard mask pattern 305 may include the same material(s). For example, the barrier film 170 and metal hard mask pattern 305 may include TiN. As shown, while the first recess 171 is formed, the metal hard mask pattern 305 may be entirely etched, but aspects of the present inventive concept are not limited thereto.

Figure 26:
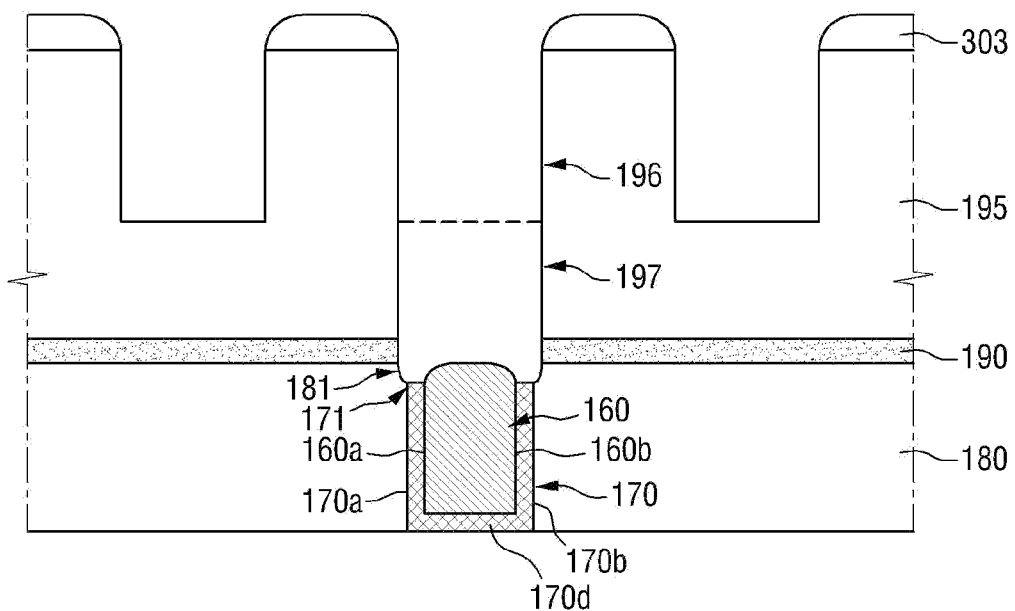
Figure 27:
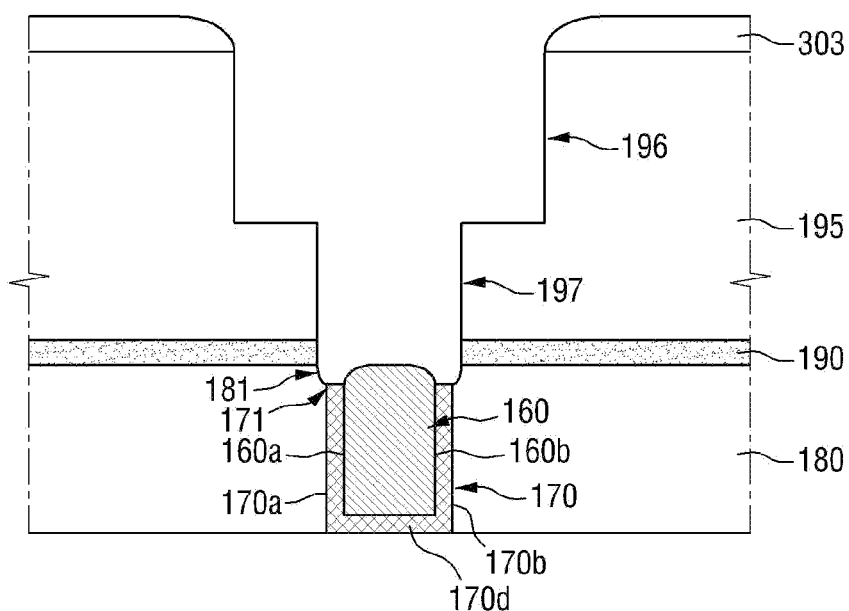

Referring to FIGS. 26 and 27, portions of the first insulation film 180 and/or the second insulation film 190 proximate first recess 171 may be removed to form the second recess 181.

Here, while the second recess 181 is formed, a trench 196 is completed. That is to say, while the second recess 181 is formed, the partial trench 196a is formed into completed trench 196. Here, while the trench 196 is completed, the etch stopper film 303 may develop a chamfered or rounded edge shape.

Now, referring back to FIGS. 1 through 5, a conductive material is deposited to sufficiently fill the trench 196 and the via hole 197. For example, the conductive material may be copper, but is not limited thereto. During this deposition process, the conductive material will fill the first recess 171 and second recess 181.

Subsequently, the first upper conductor 120, second upper conductor 110, third upper conductor 130 and via 150 may be completed using conventionally understood planarization process(es) (e.g., a CMP process). The planarization process may entirely remove the etch stopper film 303 while partially removing the third insulation film 195.

While fabricating methods for semiconductor devices according to certain embodiments of the inventive concept have been described by way of example, those skilled in the art will understand how these examples may be extended to other fabricating methods for semiconductor devices.

While the inventive concept has been particularly shown and described with reference to exemplary embodiments thereof, it will be understood by those of ordinary skill in the art that various changes in form and details may be made therein without departing from the scope of the accompanying claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
   a lower conductor having a lower conductor sidewall surface, and a top surface contiguous with the lower conductor sidewall surface, the top surface including an edge portion and a central portion;
   a barrier film having a barrier film sidewall disposed directly on the lower conductor sidewall surface; and
   a via disposed on the top surface of the lower conductor,
   wherein the lower conductor sidewall surface and the edge portion of the top surface of the lower conductor meet at a point, a top surface of the barrier film sidewall intersects the lower conductor at the point at which the lower conductor sidewall surface and the edge portion of the top surface of the lower conductor meet, the edge portion of the top surface of the lower conductor extends in an upward direction directly from the point at which the lower conductor sidewall surface and the edge portion of the top surface of the lower conductor meet, and the top surface of the barrier film sidewall is disposed at a level lower than that of the central portion of the top surface of the lower conductor.

2. The semiconductor device of claim 1, further comprising:
   a first insulation film surrounding a combination of the lower conductor and the barrier film, wherein a recessed region exists above the top surface of the barrier film sidewall and in a portion of the first insulation film proximate the top surface of the barrier film sidewall.

3. The semiconductor device of claim 2, wherein the recessed region has a width that is upwardly increasing from the top surface of the barrier film.

4. The semiconductor device of claim 3, wherein the via extends to completely fill the recessed region.

5. The semiconductor device of claim 1, wherein the width of the lower conductor, in a first direction at the point at which the lower conductor sidewall surface and the edge portion of the top surface of the lower conductor meet, is less than or equal to the width of the via in the first direction between opposite side surfaces at a bottom portion of the via.

6. The semiconductor device of claim 1, further comprising:
   a first upper conductor disposed directly on the via and having opposing sidewall surfaces that vertically align with respective opposing sidewall surfaces of the via.

7. The semiconductor device of claim 6, further comprising:
   a second upper conductor arranged in parallel with the first upper conductor and separated from the first upper conductor by a pitch that ranges from between about 10 nm to about 100 nm.

8. The semiconductor device of claim 6, wherein the via is a dual damascene via.

9. The semiconductor device of claim 1, wherein the barrier film comprises at least one of Ti and TiN.

10. The semiconductor device of claim 1, wherein the edge portion of the top surface of the lower conductor is convex.

11. A semiconductor device comprising:
    a metal layer including a first lower conductor and a second lower conductor spaced laterally from each other,
    the first lower conductor having first opposite lower conductor sidewall surfaces and a top surface,
    the top surface of the first lower conductor having an edge portion and a central portion, and
    the second lower conductor having second opposite lower conductor sidewall surfaces and a top surface;
    a first barrier film having first barrier film sidewalls directly on the first opposite lower conductor sidewall surfaces, respectively;
    a second barrier film having second barrier film sidewalls directly on the second opposite lower conductor sidewall surfaces, respectively; and
    a via disposed on the top surface of the first lower conductor, and
    wherein a top surface of at least one of the first barrier film sidewalls is disposed at a level lower than that of the central portion of the top surface of the first lower conductor, and
    top surfaces of the second barrier film sidewalls are disposed at the same level, and
    the top surface of said at least one of the first barrier film sidewalls is disposed at a level lower than that of each of the top surfaces of the second barrier film sidewalls.

12. The semiconductor device of claim 11, wherein the top surfaces of the second barrier film sidewalls are at a same level as the central portion of the top surface of the first lower conductor.

13. The semiconductor device of claim 11, further comprising:
    a first insulation film surrounding a first combination of the first lower conductor and the first barrier film, and surrounding a second combination of the second lower conductor and the second barrier film,
    wherein a recessed region exists above the top surface of the at least one of the first barrier film sidewalls and in a portion of the first insulation film proximate the top surface of each said at least one of the first barrier film sidewalls.

14. The semiconductor device of claim 13, wherein the recessed region has a width that is upwardly increasing from the top surface of the first barrier film.

15. The semiconductor device of claim 14, wherein the via extends to completely fill the recessed region.

16. The semiconductor device of claim 11, wherein the width of upper portion of the first lower conductor, in a direction between the first opposite lower conductor sidewall surfaces, is less than or equal to the width of the via in the first direction between opposite side surfaces at a bottom portion of the via.

17. The semiconductor device of claim 11, further comprising:
    a first upper conductor disposed directly on the via and having opposing sidewall surfaces that vertically align with respective opposing sidewall surfaces of the via.

18. The semiconductor device of claim 17, further comprising:
    a second upper conductor arranged in parallel with the first upper conductor and separated from the first upper conductor by a pitch that ranges from between about 10 nm to about 100 nm.

19. The semiconductor device of claim 11, wherein the edge portion of the top surface of the first lower conductor is convex, and the top surface of the second lower conductor is planar.

20. A semiconductor device comprising:
a lower conductor having opposite lower conductor sidewall surfaces, and a top surface contiguous with the lower conductor sidewall surfaces, the top surface including an edge portion and a central portion;
a barrier film having barrier film sidewalls disposed directly on the lower conductor sidewall surfaces, respectively; and
a via disposed on the top surface of the lower conductor, the via having opposite via sidewall surfaces,
wherein an uppermost surface of at least one of the barrier film sidewalls is disposed at a level lower than the level of an uppermost part of the top surface of the lower conductor, and
the lower conductor has a width in a first direction at the level of said uppermost surface of at least one of the barrier film sidewalls, the via has a width in the first direction between the opposite via sidewall surfaces at a bottom portion of the via, and said width of the lower conductor is less than or equal to said width of the via.

* * * * *